United States Patent
Chiou et al.

(10) Patent No.: US 7,388,402 B2
(45) Date of Patent: Jun. 17, 2008

(54) LEVEL SHIFT CIRCUIT

(75) Inventors: Yu-Wen Chiou, Hsinhua (TW);
Lin-Kai Bu, Hsinhua (TW)

(73) Assignee: Himax Technologies Limited, Tainan County (TW)

( * ) Notice: Subject to any disclaimer, the term of this patent is extended or adjusted under 35 U.S.C. 154(b) by 38 days.

(21) Appl. No.: 11/456,150

(22) Filed: Jul. 7, 2006

(65) Prior Publication Data

US 2008/0007298 A1    Jan. 10, 2008

(51) Int. Cl.
*H03K 19/0185*    (2006.01)
*H03K 19/094*    (2006.01)

(52) U.S. Cl. .............................. 326/68; 326/81; 327/333
(58) Field of Classification Search ................. 326/68, 326/81, 83, 86; 327/65, 333
See application file for complete search history.

(56) References Cited

U.S. PATENT DOCUMENTS 5,286,985 A * 2/1994 Taddiken .................... 257/200
6,111,430 A * 8/2000 Kuchta et al. ................. 326/68

* cited by examiner

*Primary Examiner*—Daniel D Chang
(74) *Attorney, Agent, or Firm*—Patterson & Sheridan, L.L.P.

(57) ABSTRACT

A level shift circuit is used to receive a low-voltage signal to generate a corresponding high-voltage signal. The circuit has a first transistor of a first type, a second transistor of a second type, a third transistor of the second type and a fourth transistor of the second type. The first transistor has a gate receiving the low-voltage signal and a source receiving a first supply voltage. The second transistor has a source receiving a second supply voltage and a drain coupled to a drain of the first transistor. The third transistor has a source receiving the second supply voltage, a drain outputting the high-voltage signal and a gate coupled to a gate of the second transistor. The fourth transistor has a source and a gate commonly coupled to receive a third supply voltage, and a drain coupled to the drain of the third transistor.

10 Claims, 3 Drawing Sheets

LEVEL SHIFT CIRCUIT

BACKGROUND OF THE INVENTION

1. Field of the Invention

The present invention relates to a level shift circuit, and more particularly relates to a level shift circuit used for a low temperature poly-silicon panel.

2. Description of the Related Art

Low temperature poly-silicon (LTPS) panels have the advantage of having short response times, being very bright and having high resolutions. Therefore, manufacturers are increasingly investing resources into the development of LTPS devices. With rapid development in technology, LTPS panels will possibly become very popular and replace the mainstream thin film transistor liquid crystal display (TFT-LCD) used in flat panel displays (FPD).

FIG. 1 is a circuit diagram depicting a level shift circuit of the prior art. The level shift circuit has a first PMOS transistor 140, a second PMOS transistor 130, a first NMOS transistor 110, and a second NMOS transistor 120.

A source of the first PMOS transistor 140 is coupled to a power source terminal (VDDA) 190, a gate of the first PMOS transistor 140 is coupled to a second output terminal 135, a drain of the first PMOS transistor 140 is coupled to a first output terminal 145. A source of the second PMOS transistor 130 is coupled to the power source terminal (VDDA) 190, a gate of the second PMOS transistor 130 is coupled to the first output terminal 145, a drain of the second PMOS transistor 130 is coupled to the second output terminal 135. A drain of the first NMOS transistor 110 is coupled to the second output terminal 135, a gate of the first NMOS transistor 110 is coupled to a first input terminal 115, a source of the first NMOS transistor 110 is coupled to a ground terminal (VSSA) 180. A drain of the second NMOS transistor 120 is coupled to the first output terminal 145, a gate of the second NMOS transistor 120 is coupled to a second input terminal 125, a source of the second NMOS transistor 120 is coupled to the ground terminal (VSSA) 180.

Wherein the gate of the first PMOS transistor 140 is coupled to the drain of the first NMOS transistor 110, the gate of the second PMOS transistor 130 is coupled to the drain of the second NMOS transistor 120. Therefore, when the input voltage at the first input terminal 115 turns on the first NMOS transistor 110, the first PMOS transistor 140 is turned on and there is an output voltage generated at the first output terminal 145. When the input voltage at the second input terminal 125 turns on the second NMOS transistor 120, the second PMOS transistor 130 is turned on and there is an output voltage generated at the second output terminal 135.

The level shift circuit uses CMOS transistors (PMOS and NMOS transistors), and the PMOS transistors of the CMOS transistors in the circuit are much bigger than the NMOS transistors. Thus, to integrate the PMOS transistors into the chip, the chip must be bigger. Furthermore, the cost of the design and manufacture for CMOS is much more expensive than PMOS. Therefore, a level shift circuit is needed with a new design to reduce the layout space and cost.

SUMMARY OF THE INVENTION

It is therefore an aspect of the present invention to provide a level shift circuit having smaller size and lower cost.

It is therefore another aspect of the present invention to provide a level shift circuit that has one NMOS transistor in a source driver and several PMOS transistors in a low temperature poly-silicon panel.

According to one preferred embodiment of the present invention, the level shift circuit is used to receive a low-voltage signal to generate a corresponding high-voltage signal. The circuit has a first transistor of a first type, a second transistor of a second type, a third transistor of the second type and a fourth transistor of the second type. The first transistor has a gate receiving the low-voltage signal and a source receiving a first supply voltage. The second transistor has a source receiving a second supply voltage and a drain coupled to a drain of the first transistor. The third transistor has a source receiving the second supply voltage, a drain outputting the high-voltage signal and a gate coupled to a gate of the second transistor. The fourth transistor has a source and a gate commonly coupled to receive a third supply voltage, and a drain coupled to the drain of the third transistor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
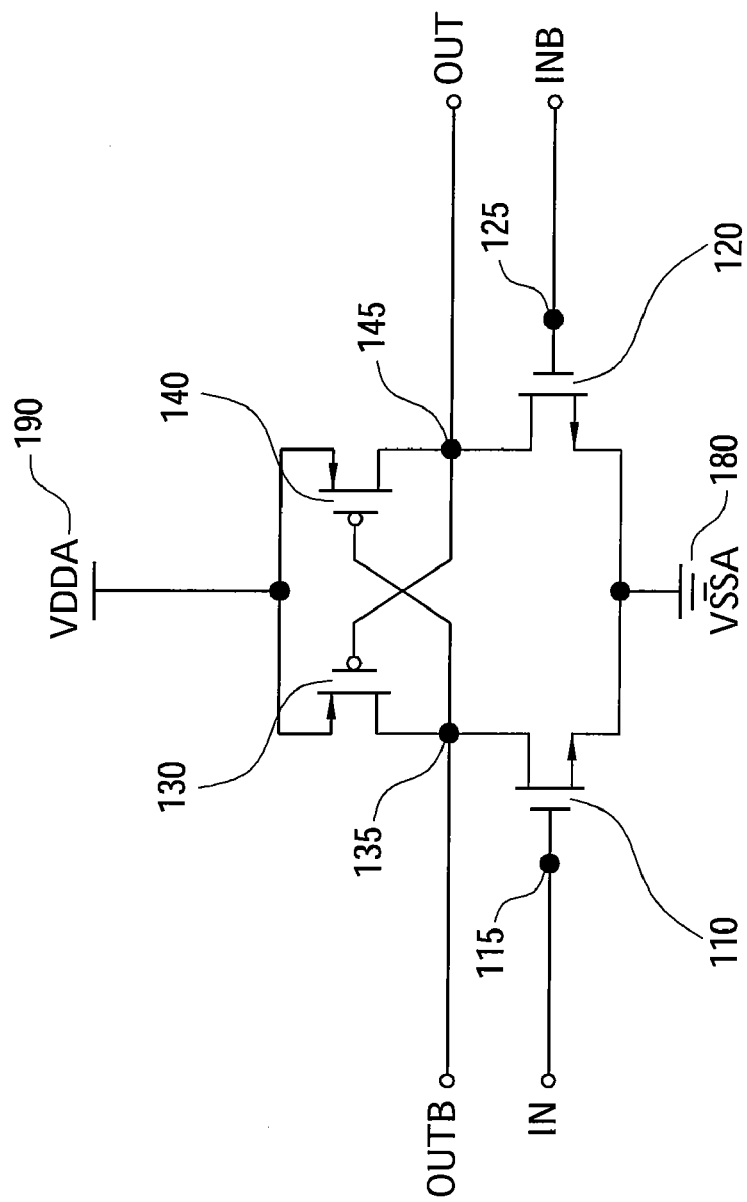
FIG. 1 is a circuit diagram depicting a level shift circuit of the prior art.

Reference will now be made in detail to the present preferred embodiments of the invention, examples of which are illustrated in the accompanying drawings. Wherever possible, the same reference numbers are used in the drawings and the description to refer to the same or like parts.

This invention offers a level shift circuit used for a low temperature poly-silicon panel. In order to reduce the size and cost of the level shift circuit, the level shift circuit is divided into two parts. One part is assembled with at least one NMOS transistor, and another part is assembled with several PMOS transistors. The NMOS transistor is disposed in a source driver, and the PMOS transistors are disposed in a low temperature poly-silicon panel. Furthermore, in order to use a low cost source driver that uses low input voltage, the NMOS transistor disposed in the source driver needs some modification.

The level shift circuit of one preferred embodiment of the present invention is arranged to receive a low-voltage signal to generate a corresponding high-voltage signal. The circuit has a first transistor of a first type, a second transistor of a second type, a third transistor of the second type, and a fourth transistor of the second type. The first transistor has a gate receiving the low-voltage signal and a source receiving a first supply voltage (VSSA). The second transistor has a source receiving a second supply voltage (VDDA) and a drain coupled to a drain of the first transistor. The third transistor has a source receiving the second supply voltage (VDDA), a drain outputting the high-voltage signal and a gate coupled to a gate of the second transistor. The fourth transistor has a source and a gate commonly coupled to receive a third supply voltage (Low Voltage), and a drain coupled to the drain of the third transistor.

Figure 2:
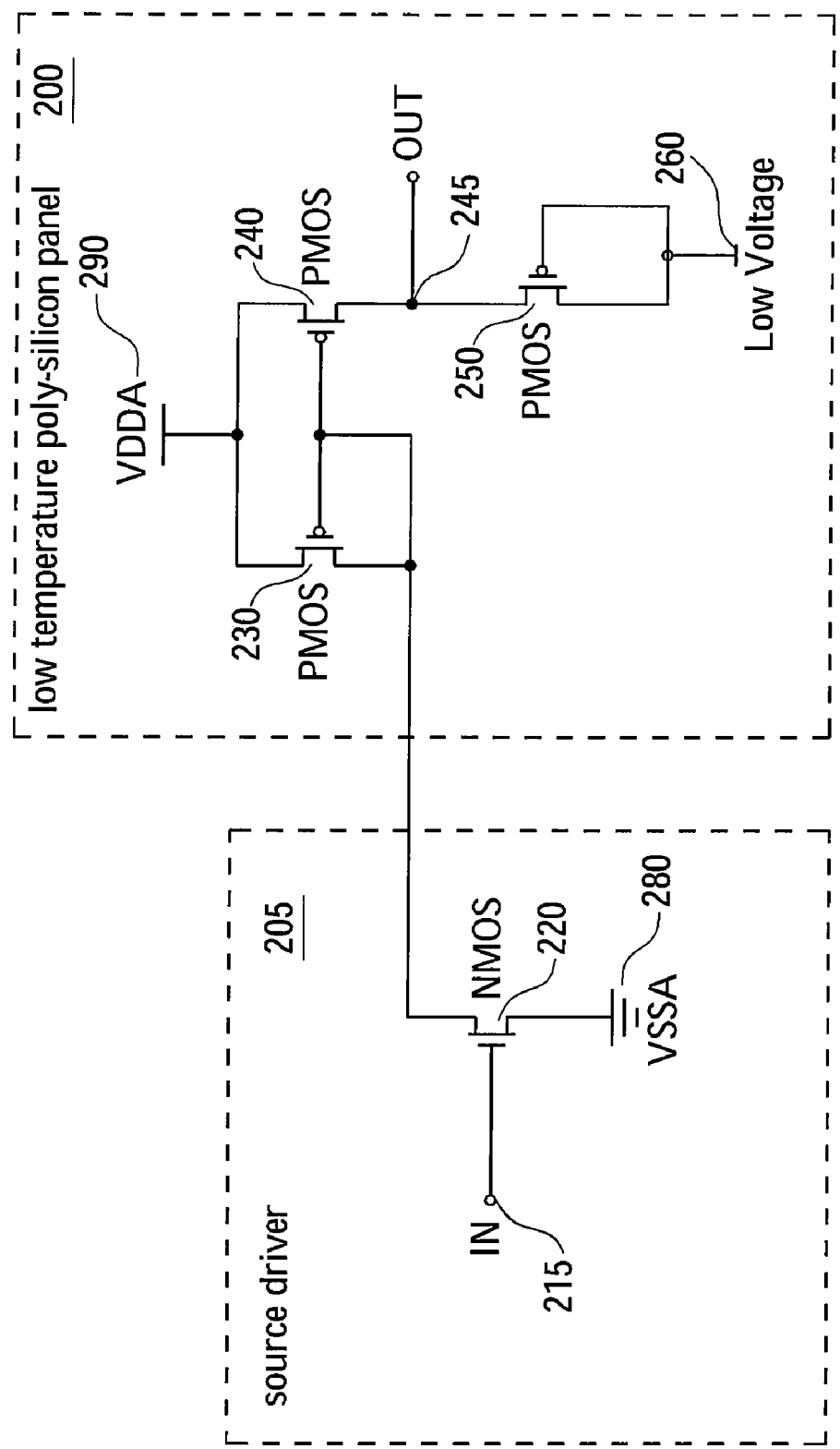
FIG. 2 is a circuit diagram depicting a level shift circuit of one preferred embodiment of the present invention.

FIG. 2 is a circuit diagram depicting a level shift circuit of one preferred embodiment of the present invention. The level shift circuit is used for a low temperature poly-silicon panel 200. The level shift circuit has a NMOS transistor 220, a first PMOS transistor 230, a second PMOS transistor 240 and a third PMOS transistor 250. The NMOS transistor 220 is disposed in a source driver 205 and all the PMOS transistors 230, 240 and 250 are disposed in the low temperature poly-silicon panel 200. A gate of the NMOS transistor 220 is capable of receiving an input voltage at an input terminal 215. A source of the NMOS transistor 220 is coupled to a ground terminal (VSSA) 280. A source of the first PMOS transistor 230 is coupled to a power terminal (VDDA) 290. A drain of the first PMOS transistor 230 is coupled to a drain of the NMOS transistor 220. A source of the second PMOS transistor 240 is coupled to the power terminal 290. A drain of the second PMOS transistor 240 is capable of generating an output voltage at an output terminal 245. A gate of the second PMOS transistor 240 is coupled to the gate of the first PMOS transistor 230, the drain of the first PMOS transistor 230 and the drain of the NMOS transistor 220. A source and a gate of the third PMOS transistor 250 are coupled to a low voltage terminal 260. A drain of the third PMOS transistor 250 is coupled to the drain of the second PMOS transistor 240.

The PMOS transistors 230, 240, and 250 described above can be implemented when the low temperature poly-silicon panel is designed and manufactured. By this method, the total cost of the level shift circuit and the panel is reduced.

Figure 3:
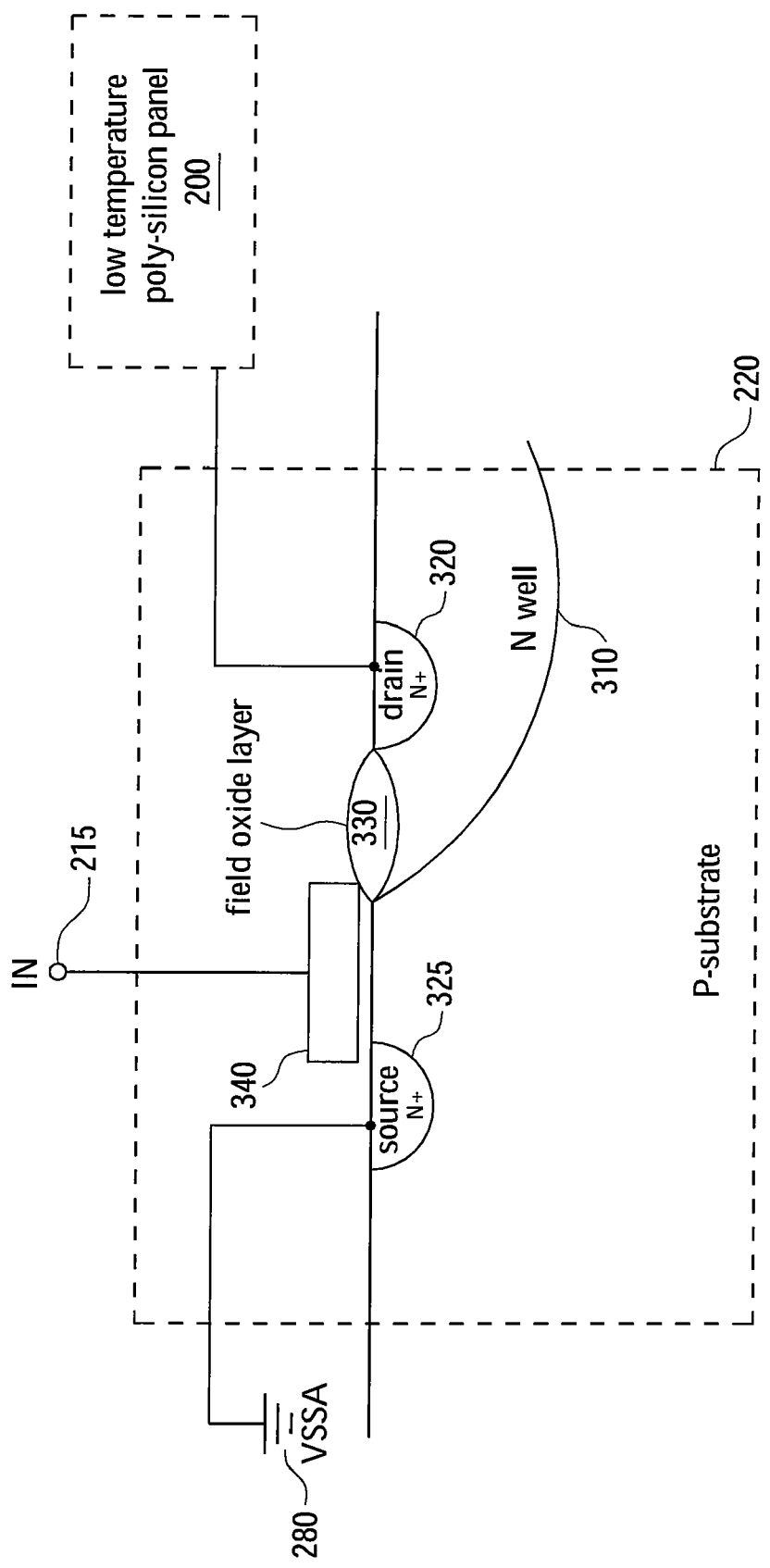
FIG. 3 is a cross-sectional side view depicting the NMOS of a level shift circuit of one preferred embodiment of the present invention.

In order to conform with low cost source drivers which use low voltage, the NMOS transistor disposed in the source driver must be modified. FIG. 3 is a cross-sectional side view depicting the NMOS transistor of a level shift circuit of one preferred embodiment of the present invention. The NMOS transistor 220 has a gate 340, a source 325 coupled to the ground terminal (VSSA) 280, and a drain 320 coupled to the low temperature poly-silicon panel 200. In addition, the NMOS transistor 220 further has an N well 310 to wrap around the drain 320 of the NMOS transistor 220 disposed in the source driver 205. Otherwise, the NMOS transistor 220 further has a field oxide layer 330 disposed between the drain 320 and the gate 340 of the NMOS transistor 220, and the field oxide layer 330 is wrapped around by the N well 310. When a low voltage is inputted to the gate 340 at the input terminal 215, there is a big voltage drop from the drain 320 to the gate 340 and current leakage is probably induced. Thus, the N well 310 and the field oxide layer 330 disposed in the P-substrate can prevent current leakage caused by the big voltage drop of the NMOS transistor 220.

The second supply voltage (applied on power terminal, VDDA 290) is higher than the first supply voltage (applied on ground terminal, VSSA 280) and the third supply voltage (applied on Low Voltage 260); the first supply voltage is higher than the third supply voltage. Generally speaking, the first supply voltage (VSSA), the second supply voltage (VDDA) are 0 [volt], 5~10 [Volt] respectively. The third supply voltage (Low Voltage) is smaller than 0 [volt]. However, in some circuits, the first, second and third supply voltages can be set to be another suitable voltage according to the actual situations.

In the level shift circuit described above, the range of the input voltage is between approximately 0 volt and 5 volt. To save power, the input voltage is decreasing. For example, the power consumption of the input voltage that is 2.5 volt is less than the power consumption of the input voltage that is 3.3 volt.

The range of the output voltage depends on the loading and the properties of the low temperature poly-silicon panel 200. Generally speaking, the range of the output voltage is between approximately −20 volt and 20 volt. Furthermore, the voltage of the low voltage terminal 260 depends on the loading and the properties of the low temperature poly-silicon panel 200, too; the voltage of the low voltage terminal 260 is smaller than 0 volt.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A level shift circuit receiving a low-voltage signal to generate a corresponding high-voltage signal, the circuit comprising:
a first transistor of a first type, having a gate receiving the low-voltage signal and a source receiving a first supply voltage, wherein the first transistor is located in a source driver for a low temperature poly-silicon panel, and the first type is N type;
a second transistor of a second type, having a source receiving a second supply voltage and a drain coupled to a drain of the first transistor, wherein the second type is P type;
a third transistor of the second type, having a source receiving the second supply voltage, a drain outputting the high-voltage signal and a gate coupled to a gate of the second transistor; and
a fourth transistor of the second type, having a source and a gate commonly coupled to receive a third supply voltage, and a drain coupled to the drain of the third transistor,
wherein the second, third and fourth transistors are located in the low temperature poly-silicon panel.

2. The level shift circuit claimed in claim 1 further comprising an N well to wrap around the drain of the first transistor.

3. The level shift circuit claimed in claim 2 further comprising a field oxide layer disposed between the drain and the gate of the first transistor, wherein the field oxide layer is wrapped around by the N well.

4. The level shift circuit claimed in claim 1 wherein the second supply voltage is higher than the first and third supply voltage.

5. The level shift circuit claimed in claim 4 wherein the first supply voltage is higher than the third supply voltage.

6. The level shift circuit claimed in claim 5 wherein the dynamic range of the low-voltage signal is between approximately 0 volt and 5 volt.

7. The level shift circuit claimed in claim 5 wherein the dynamic range of the high-voltage signal is between approximately −20 volt and 20 volt.

8. A display device comprising:
a source driver comprising a first transistor of a N type, wherein the first transistor has a gate receiving a low-voltage signal and a source receiving a first supply voltage; and
a low temperature poly-silicon panel driven by the source driver, comprising:

a second transistor of a P type, having a source receiving a second supply voltage and a drain coupled to a drain of the first transistor;

a third transistor of the P type, having a source receiving the second supply voltage, a drain outputting a high-voltage signal and a gate coupled to a gate of the second transistor; and a fourth transistor of the P type, having a source and a gate commonly coupled to receive a third supply voltage, and a drain coupled to the drain of the third transistor, wherein the first transistor, the second transistor, the third transistor, and the fourth transistor are components of a level shift circuit.

9. The display device claimed in claim 8, further comprising an N well to wrap around the drain of the first transistor.

10. The display device claimed in claim 9, further comprising a field oxide layer disposed between the drain and the gate of the first transistor, wherein the field oxide layer is wrapped around by the N well.

* * * * *